United States Patent [19]

Laub

[11] Patent Number: 5,423,687
[45] Date of Patent: Jun. 13, 1995

[54] ELECTRONIC COMPONENT UPGRADE CONNECTOR AND CONTACT

[75] Inventor: Michael F. Laub, Etters, Pa.

[73] Assignee: The Whitaker Corporation, Wilmington, Del.

[21] Appl. No.: 310,901

[22] Filed: Sep. 22, 1994

Related U.S. Application Data

[63] Continuation of Ser. No. 125,374, Sep. 21, 1993, abandoned, which is a continuation-in-part of Ser. No. 27,994, Mar. 8, 1993, Pat. No. 5,364,278.

[51] Int. Cl.6 ............................................. H01R 9/09
[52] U.S. Cl. ...................................... 439/69; 439/912
[58] Field of Search .................... 439/68, 69, 70, 71, 439/77–82, 330, 331, 492, 494, 912, 912.1

[56] References Cited

U.S. PATENT DOCUMENTS

| | | |
|---|---|---|
| 4,192,565 | 3/1980 | Gianni . |
| 4,427,249 | 1/1984 | Bright et al. . |
| 4,657,324 | 4/1987 | Kamono et al. . |
| 4,671,592 | 6/1987 | Ignasiak et al. ............... 439/331 |
| 4,696,525 | 9/1987 | Coller et al. ................... 439/69 |
| 4,866,374 | 9/1989 | Cedrone ......................... 324/158 F |
| 4,996,476 | 2/1991 | Balyasny et al. ............ 439/912.1 X |
| 5,073,116 | 12/1991 | Beck, Jr. ........................... 439/71 |
| 5,166,609 | 11/1992 | Cole et al. ....................... 324/158 F |
| 5,205,741 | 4/1993 | Steen et al. ................... 439/912.1 X |
| 5,318,451 | 6/1994 | DelPrete et al. .................... 439/69 |

FOREIGN PATENT DOCUMENTS 59-96753 6/1984 Japan .

Primary Examiner—Khiem Nguyen
Attorney, Agent, or Firm—June B. Schuette; Driscoll A. Nina

[57] ABSTRACT

A connector and contact for electrically interconnecting terminals of an upgraded circuit module to the leads of a pre-existing electronic component affixed to contact pads on a substrate through a separable connection, the connector having a frame upon which contacts are retainably positioned to form the interconnection between respective terminals and leads and a clamping mechanism for holding at least the connector and the pre-existing electronic component together to maintain the electrical interconnection. The circuit module being mountable either directly above the pre-existing electronic component in piggy-back manner or at a remote location by placing conductive pathways, such as a flat flex cable, between the terminals and the contacts.

7 Claims, 13 Drawing Sheets

ELECTRONIC COMPONENT UPGRADE CONNECTOR AND CONTACT

This application is a Continuation of U.S. application Ser. No. 08/125,374 filed Sep. 21, 1993, now abandoned, in turn, a Continuation In Part of U.S. application Ser. No. 08/027,994 filed Mar. 8, 1993, now U.S. Pat. No. 5,364,278.

FIELD OF THE INVENTION

The invention relates to an electrical connector for providing a separable electrical interconnection between the leads extending from a pre-existing electronic component and a circuit module.

BACKGROUND OF THE INVENTION

The technology of the electronics industry, especially in the computer industry, is improving so rapidly that the new equipment has such desirable features that the old equipment is rendered essentially obsolete well before the end of its designed lifespan. When this happens the old equipment is normally scrapped, wasting a significant amount of still useful components.

Presently, one electronic component that is evolving rapidly is the micro-processor, a component that is contained within devices ranging from the personal computer to industrial controllers. The new micro-processors allow the user to accomplish tasks in a way that were not imagined just a couple of years ago, thereby making them very desirable and the devices containing the older micro-processors essentially worthless. One way to take advantage of the still useful components within the old equipment is to upgrade the micro-processor, giving the old equipment capability close to that of the newer equipment.

There are numerous ways to approach the problems associated with upgrading the micro-processor which generally has leads soldered directly to a printed circuit board. One method is that the old micro-processor can be removed from the board by desoldering and the new microprocessor can be resoldered in its place. However, this is difficult to accomplish, especially in the field, due to the high density of leads associated with the micro-processors.

Another method would be for the manufacturer to incorporate chip carrier sockets onto the printed circuit board during manufacture that would allow a user to change micro-processors without soldering. However, a problem with this approach is that incorporating sockets onto the printed circuit board must be done at the time of manufacture or the same problems associated with resoldering exist. The use of sockets adds expense to the end product because of the additional cost of the socket and the additional costs of assembly. Another problem, inherent in both of the above solutions, is there is no way to accommodate upgrades that have different lead configurations.

What is needed is a user-friendly connector that can be installed by an end-user in the field for connecting an upgraded micro-processor component directly over the existing micro-processor and running the system through the upgraded component. What is also needed is a user friendly connector as described above that provides for the upgraded micro-processor to be positioned at some convenient remote location from the pre-existing component.

SUMMARY OF THE INVENTION

The present invention is a connector for electrically interconnecting terminals of a circuit module, for example a multi-component micro-processor upgrade located above a pre-existing electronic component such as an existing micro-processor, to respective leads extending from the pre-existing electronic component, where the leads are affixed to respective contact pads on a substrate, such as a printed circuit board. The connector has a frame with opposing side portions that generally encompass the pre-existing electronic component, at least where the leads extend therefrom. These side portions have a plurality of channels correspondingly spaced to the terminals of the circuit module and the leads of the pre-existing electronic component. A plurality of contacts are individually retained within at least some of the channels for electrically connecting the terminals to their respective leads. Each contact has a first contact portion for establishing a separable electrical connection with the lead of the pre-existing electronic component as the connector is mated therewith and a second contact portion for establishing an electrical connection with the respective terminal of the circuit module as the connector is mated therewith. The connector also incorporates a mechanism for maintaining the circuit module, the connector, and the pre-existing electronic package in the proper mating relation, whereby the connector establishes an electrical interconnection from the terminals of the circuit module, through the contacts of the connector, to the respective leads of the pre-existing electronic component and through to the corresponding contact pads of the substrate.

It is an object of this invention to provide a connector for providing a separable electrical interconnection between the leads extending from a pre-existing electronic component mounted upon a substrate and the terminals of a circuit module. It is another object of this invention to provide a connector that can be easily installed in the field. It is yet another object of this invention to provide a contact for use with the connector that minimizes the potential for damaging the electrical interface between the leads of the pre-existing electronic component and the substrate while still providing a reliable electrical connection.

It is a feature of this invention that the contact may be compliantly engaged to both the lead of the pre-existing electronic component and the terminals of the circuit module. It is another feature of this invention that a first contact portion establishes a separable electrical connection with the lead of the pre-existing electronic component and a second contact portion may be adapted to establish an electrical connection with the respective terminal of the circuit module through various types of interfaces. It is yet another feature of this invention to have a mechanism for maintaining the circuit module, the connector, and the pre-existing electronic package in proper mating relation.

It is an advantage of this invention that a wiping interface with the leads of the pre-existing component may be established by the contact allowing for a separable interconnection. It is another advantage of this invention that the contact may include a back-up arm for retainably positioning the contact within the contact frame. It is yet another advantage of this invention that the circuit module may be positioned above the pre-existing electronic component with direct connection to the contact of the connector or that the circuit module may be positioned at a location remote of the pre-existing electronic component interconnected with the contacts of the connector by way of a conductive path, such as a flat flex cable.

DETAILED DESCRIPTION OF THE INVENTION

Figure 1:
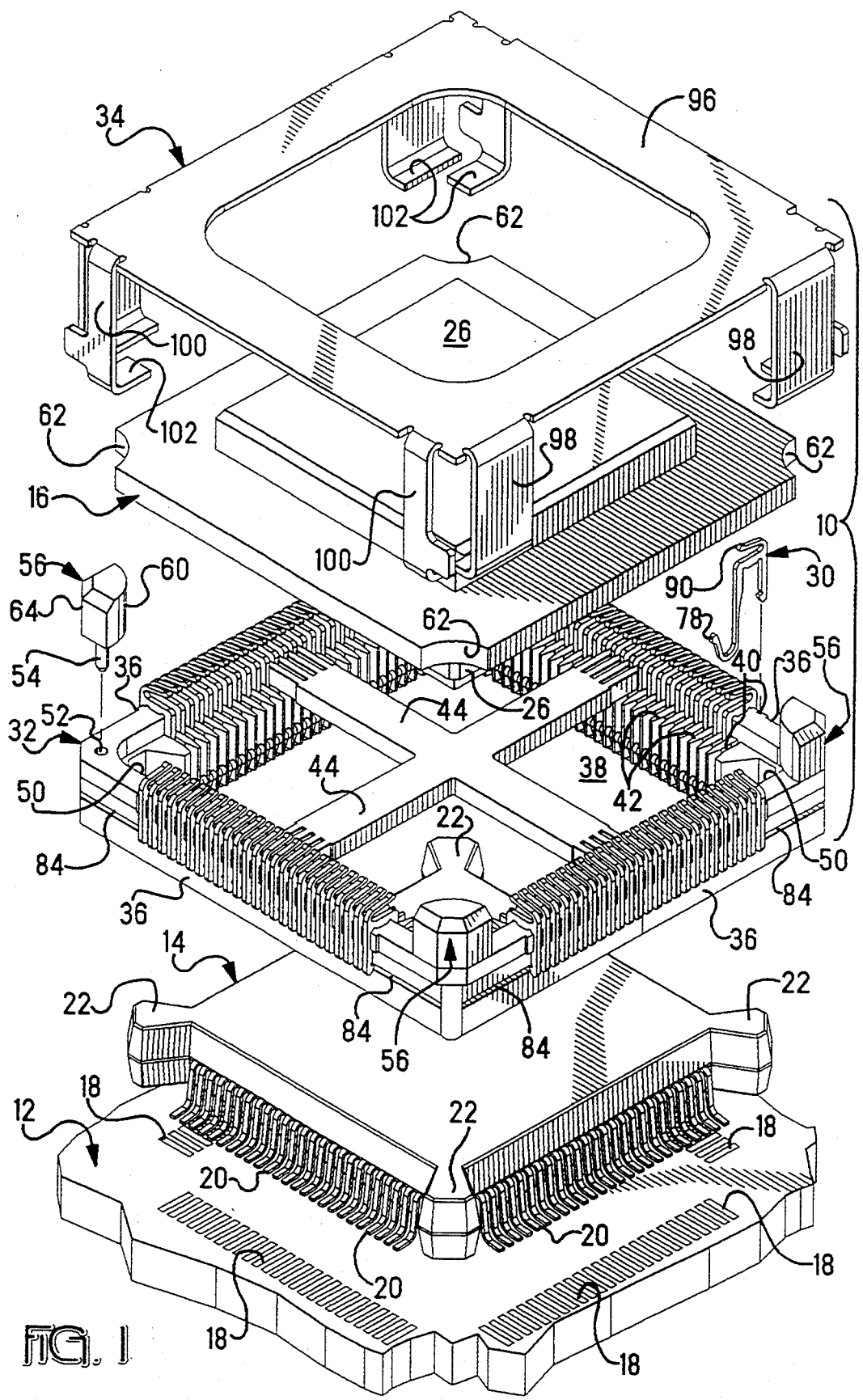
FIG. 1 is a partially exploded upper perspective view of the connector and the associated components.
Figure 2:
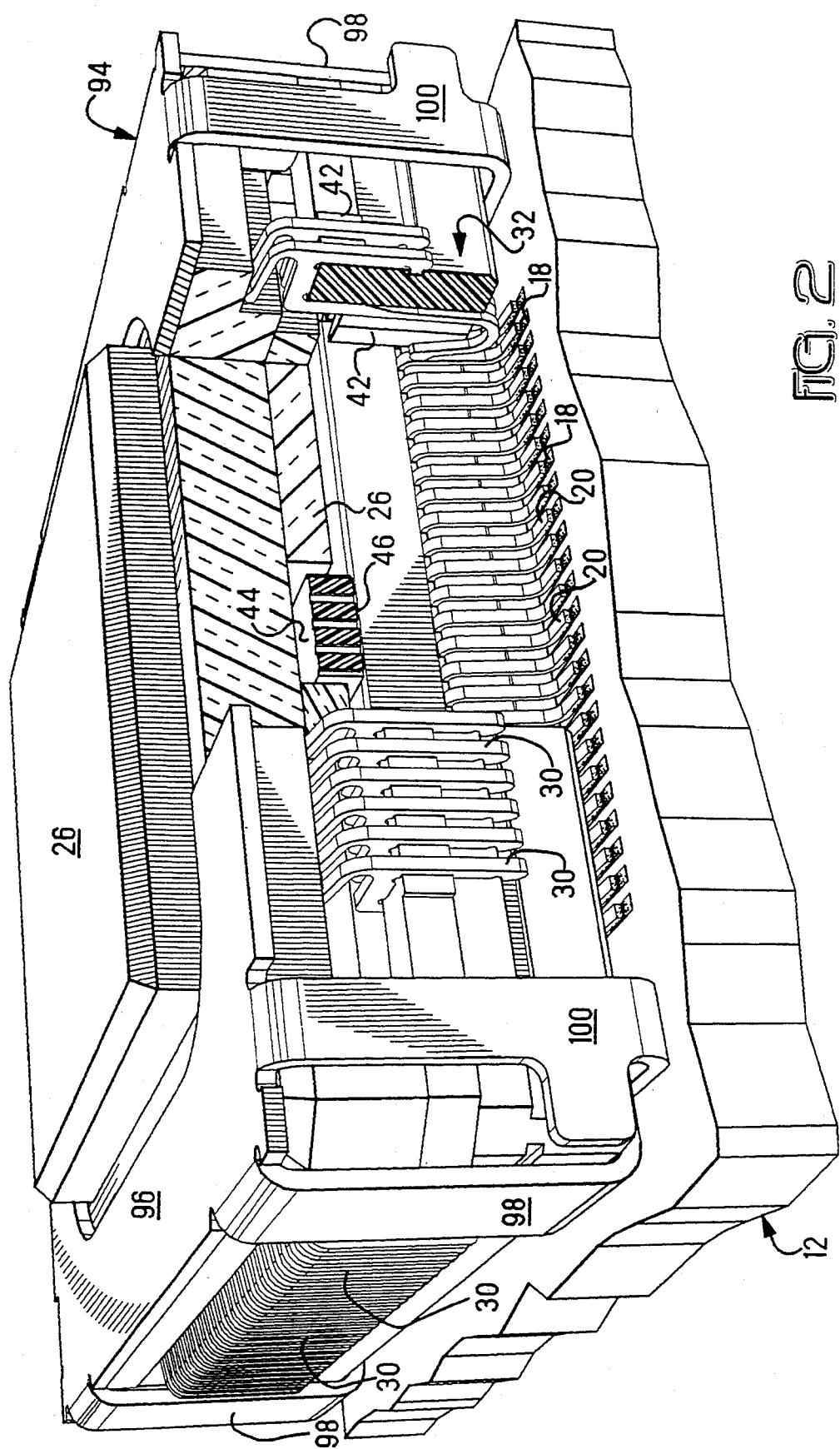
FIG. 2 is a partial cut-away perspective view of the assembled connector.

FIG. 1 shows an electrical connector 10 of the present invention along with a substrate 12, a pre-existing electronic component 14 and a circuit module 16. The substrate 12 may be, for example, a printed circuit board having a plurality of contact pads 18 for electrical interconnection with leads 20 that extend from the pre-existing electronic component 14. As an example, the pre-existing electronic component 14 may be a computer micro-processor packaged in a Plastic-Quad-Flat-Pack (PQFP) having a plurality of gull-wing leads 20 extending from the perimeter and four corner bumpers 22. The electrical connection with the substrate 12 may be a soldered joint 24, established through standard surface mounting techniques, or it may be any of a number of other types of joints.

The circuit module 16 may be a multi-component module having a plurality of electronic components 26 disposed on one or both sides of the module 16 of a multi-layered printed circuit board or it may be a single electronic component 26 attached to a printed circuit board through the use of a chip socket (not shown). These electronic components 26 are electrically connected to terminals 28 (best shown in FIG. 8) corresponding to at least some of the leads 20 of the pre-existing electronic component 14. These terminals 28 are constructed for electrical interconnection, for example through wiping, through-hole or surface mount techniques.

The connector 10 incorporates a plurality of contacts 30 into a frame 32 that will be located between the pre-existing electronic component 14 and the circuit module 16 in order to electrically interconnect the terminals 28 to the leads 20. A mechanism 34 for maintaining the circuit module 16, the connector 10, and the pre-existing electronic component 14 in proper mating relation is also included.

The connector frame 32 has opposing side portions 36 that define a cavity 38 for accepting the pre-existing electronic component 14, whereby the side portions 36 generally surround the pre-existing electronic component 14 along the leads 20. The side portions 36 have a plurality of channels 40 that are in a spaced alignment with at least the terminals 28 and the respective leads 20 that are desired to be interconnected. The channels 40 are constructed to individually receive the contacts 30 and are defined by a series of spaced apart webs 42 on the side portions 36.

The side portions 36 are interconnected across the cavity 38 by stiffeners 44 that provides additional rigidity to the side portions 36. Although not required, the bottom surface 46 of the stiffener may locate the connector 10 above the pre-existing electronic component. This could also be accomplished by having tabs (not shown) extend into the cavity 38 from the side portions 36 if stiffeners 44 were not used. As used in this application, the relationship of the components is to be viewed relative to the substrate 14 as it is recognized that the substrate 14 could be mounted in various orientations (for example, vertically or horizontally), thereby changing orientation of the components.

The frame 32 also has a keying feature 50 for maintaining the channels 40 of the side portions 36 in their proper position relative to the leads 20 of the pre-existing circuit component 14. The keying feature 50 illustrated is a cut-out in the opposing side portions 36 shaped to correspond to the bumpers 22 of the pre-existing circuit component 14 and sized to receive the bumper 22 in as close a sliding fit as necessary to maintain proper the alignment with the leads 20. Other keying features 50 may be incorporated depending on the configuration of the pre-existing circuit component 14.

The frame 32 also incorporates orientation features 52 for positioning the circuit module 16 relative the frame 32. The orientation feature 52 shown is a hole that is constructed to closely receive a first end 54 of a pin 56. A second end 58 of the pin has a cylindrical surface 60 formed to fit closely with a circular cutout 62 in the circuit module 16, thereby closely aligning the terminals 28 of the circuit module 16 with the channels 40 of the side portions 36. Opposite the cylindrical surface 60, the pins 56 have a multi-faceted relief surface 64 formed to prevent interference with the other components of the connector 10.

Typically, the frame 32 will be molded from a dielectric material. The mold may incorporate the features mentioned above or they may be machined into the frame 32 after the molding process. For example, the pins 56, used to orientate the circuit module, may be a molded-in feature of the frame 32.

The contacts 30 are constructed for electrically interconnecting the terminals 28 of the circuit module 16 to the respective leads 20 extending from the pre-existing electronic component 14. The contact 30 is constructed to be retainably positioned within the channels 40 that are defined by the webs 42 on the side portions 36 of the frame 32. The contact 30 may be stamped from various metals and then plated to establish the desired mechanical properties and electrical conduction properties.

Figure 3:
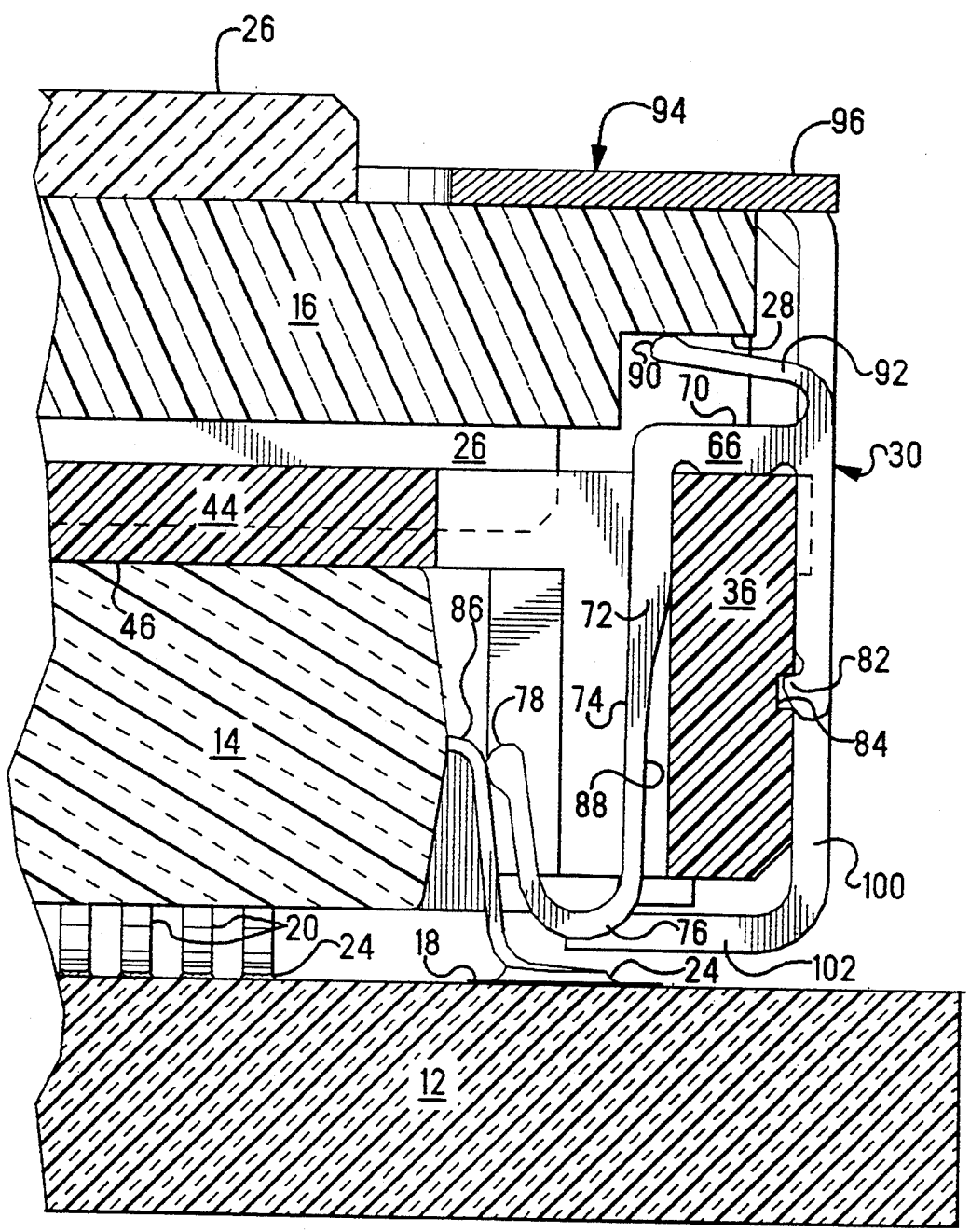
FIG. 3 is a cross-sectional view of the assembled connector.

The contact 30 has a base 66 with a first side 68 and a second side 70. From the first side 68, a contact arm 72 extends along a generally straight section 74 before merging into a bent back portion 76 that includes a first contact portion 78 constructed for wiping engagement with the lead 20. Also extending from the first side 68 is a back-up arm 80 adapted to retainably position the contact 30 to the frame 32 in one of the plurality of channels 40. An opening 81 is defined between the contact arm 72 and the back-up arm 80 that is sized to receive the side portion 36 of the frame 32. When the contact 30 is placed on the side portion 36, within one of the channels 40 (as best observed in FIG. 3), a hook 82 on the back-up arm 80 engages a recess 84 on the side portion 36.

The first contact portion 78 is positioned on the contact arm 72 to engage the lead 20 as far as possible from the solder joint 24 of the leads 20 of the pre-existing electronic component 14 and the contact pads 18 of the substrate 12. This is to minimize the stresses imposed on the solder joint 24, which due to its ductile nature is especially susceptible to creep when subjected to a constant force, when establishing the wiping engagement with the lead 20. Not only does this positioning of the first contact portion 78 take advantage of compliance in the leads 20, it also positions the first contact portion 78, and therefore the forces acting inward against the lead 20, as close as possible to a portion 86 of the lead 30 that extends in an essentially horizontal orientation, thereby minimizing the resultant forces exerted on the solder joint.

The straight section 74 of the contact arm 72 has a relieved section 88 that enables the contact arm 72 to exhibit some compliance while maintaining positive retainment within the channel 40 and sufficient stiffness to enable the wipe to occur as the connector 10 is mated to the pre-existing component 14. In order to achieve the desired compliance, the generally straight section 74 of the contact arm 72 extends beyond where the wiping interconnection occurs before the bent back portion 76 establishes the interconnection in the desired location. By extending the generally straight section 74 as far as possible without interfering with other components, the contact arm 72 is provided with its maximum compliance.

As the first contact portion 78 is compliantly pushed back by engagement with the lead 20, exerting both a force and a torque on the side portion 36. These are transmitted into the side portion 36 by its close fit within the opening 80 and the engagement of the hook 82 with the recess 84. The stiffeners 44 counter-act the resultant forces and the torque from distorting the side portions 36.

Figure 5:
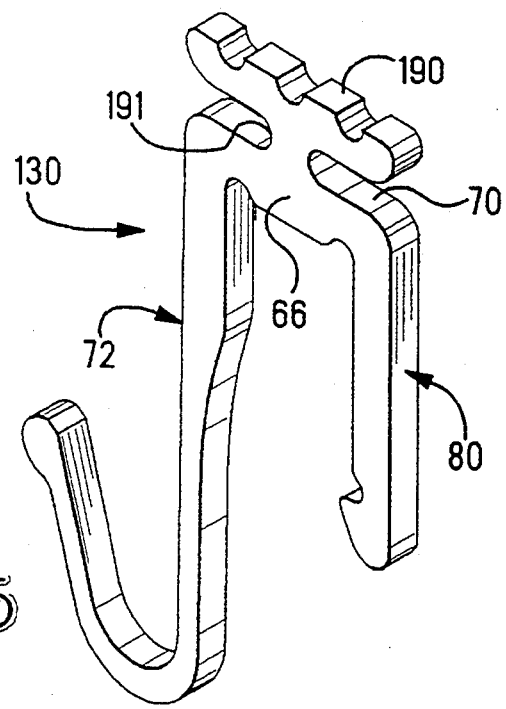
FIG. 5 is a perspective view of an alternative embodiment of the contact.
Figure 6:
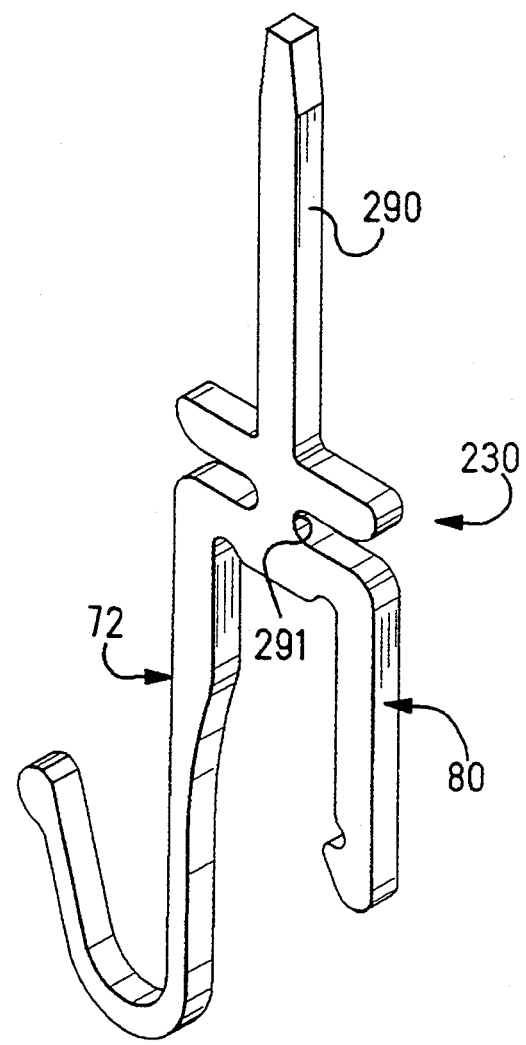
FIG. 6 is a perspective view of yet another alternative embodiment of the contact.
Figure 7:
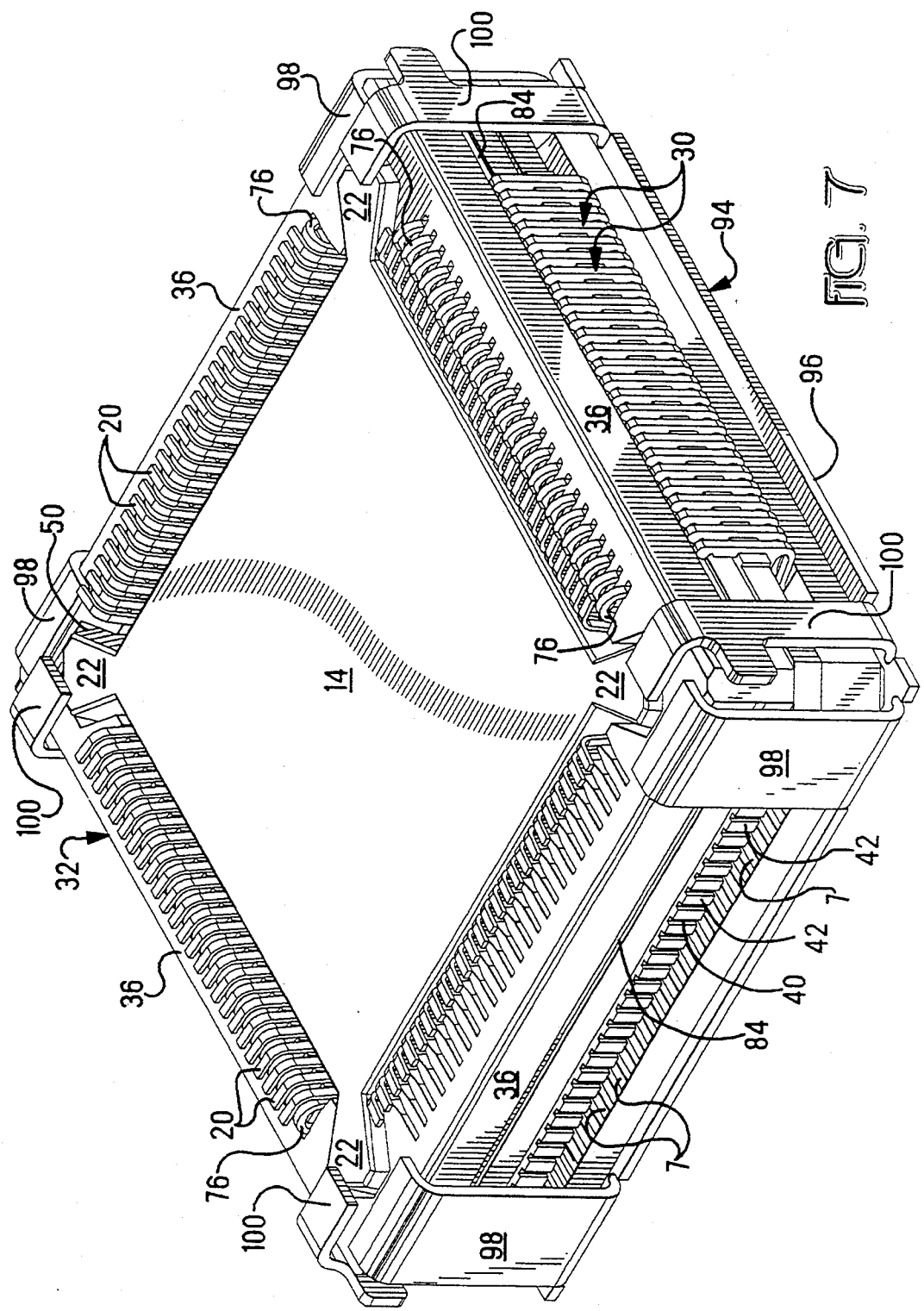
FIG. 7 is a lower perspective view of the assembled connector with one row of contacts removed.

Extending above the second side 70 of the base 66 of the contact 30 is the second contact portion 90 incorporated into a second contact arm 92 for establishing a wiping engagement with the terminal 28 of the circuit module 16. As the second contact arm 92 is deflected downward by the circuit module 16, the second contact portion 90 wipes the terminal 28 to provide the electrical interconnection. This second contact arm 92 and second contact portion 90 can be adapted for a number of different types of electrical interconnections with the circuit module 16. FIG. 5 shows a contact 130 that has a second contact portion 190 adapted for a surface mounting solder connection to the terminals 28 of the circuit module 16 connected with the second side 70 of the base 66 by a resilient web 191. FIG. 6 shows a similar contact 230 that has a pin 290 as the second contact portion mounted on top of a resilient web 291 and adapted for plated-through-hole or soldered through-hole terminals. The resilient webs 191,291 of these alternative connector embodiments 130,230 provide the compliance at the interconnection that is inherent in the wiping connection to accommodate slight manufacturing inconsistencies and varying thermal expansions.

Figure 8:
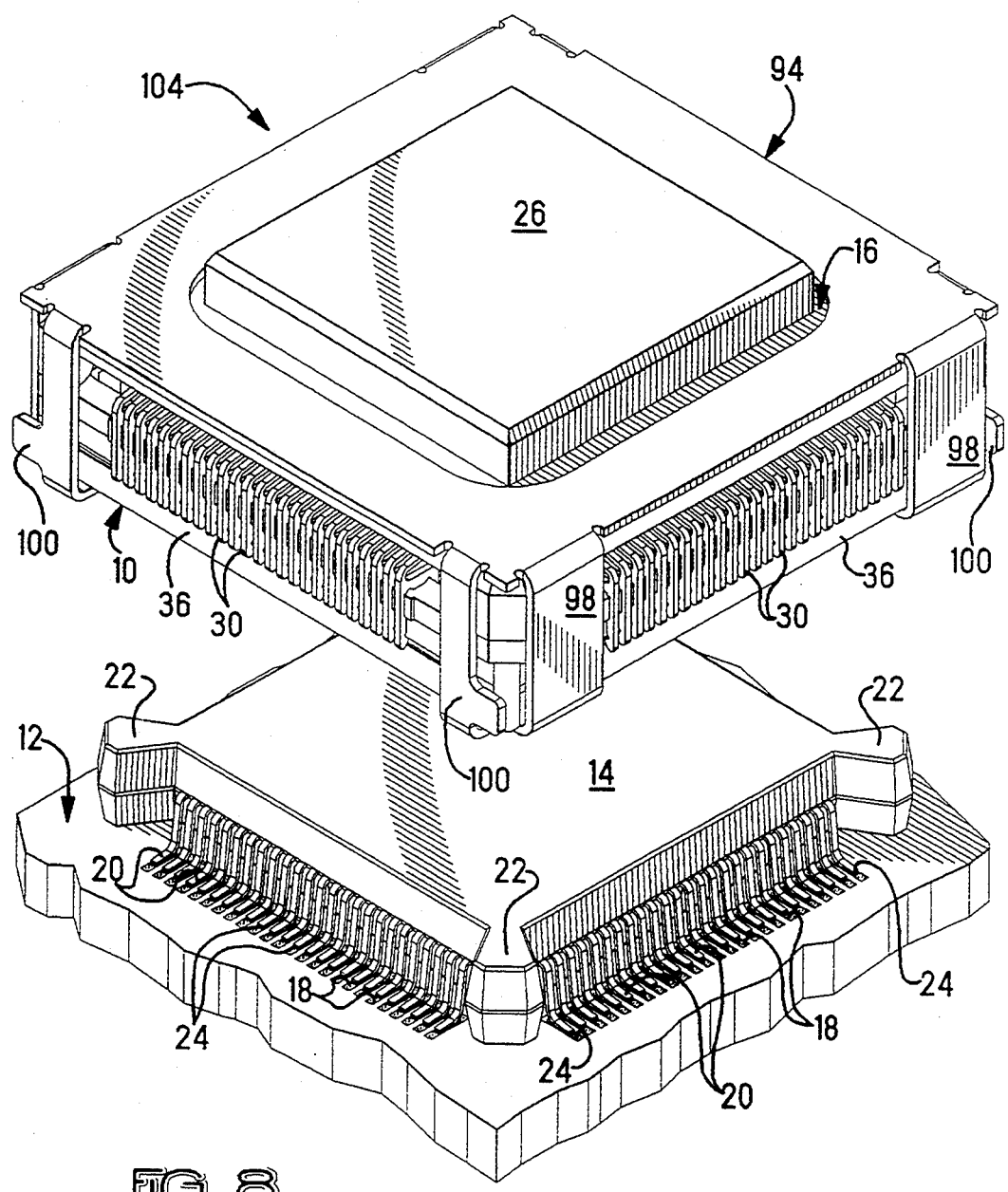
FIG. 8 is a perspective view of a package that includes the connector and circuit module as might be received by the end-user for installation.

The connector 10 also includes a mechanism 34 for maintaining the circuit module 16, the connector 10, and the pre-existing electronic component 14 in proper mating relation so that the electrical interconnection is established from the terminals 28 of the circuit module 16, through the contacts 30 of the connector 10, to the respective leads 20 of the pre-existing electronic component 14 and through to the corresponding contact pads 18 of the substrate 12. The clamping mechanism 34 shown in the drawings is a clip 94. The clip 94 has a plate 96 constructed to fit upon the circuit module 16 without interfering with the components 26 thereupon. First grippers 98 extend from the plate 96 and are constructed to hold the frame 32 of the connector 10 tightly to the circuit module 16 by fitting tightly under the frame 32, as best seen in FIG. 8. These first grippers 98 assure that the second contact portion 90 of the contact 30 remains in electrical engagement with the terminals 28 of the circuit module 16. Second grippers 100 also extend from the plate 96 and are constructed to fit under the bumpers 22 of the pre-existing electronic component 14. These second grippers 100 assure that a package 104 that includes the circuit module 16 and the connector 10 is held tightly to the pre-existing electronic component 14. It may be necessary to spread these second grippers 100 slightly during installation to clear the bumpers 22 as the package 104 is placed on the pre-existing electronic component 14.

The clip 94 may be constructed from a thin piece of metal that could be spring tempered. The grippers 98,100 are sections of the thin piece of metal that are bent-under, each of which have a clasp 102 formed by an additional bend to engage the respective components 10,14. The clip 94 may also be molded from plastic.

It is envisioned that if one of the two alternative contact designs 130,230 are used, it may not be necessary to hold the circuit module 16 to the frame 32 because the second contact portion 90 of the contact 30 may be soldered to the terminal 28. This soldered joint could serve the function of the first grippers 98 and, therefore is envisioned to be part of the mechanism 34 to hold the circuit module 16, the connector 10, and the pre-existing electronic component 14 together. Similarly, it may also be possible to permanently bond the first contact portion 78 to the lead 20 by soldering or conductive adhesive, thereby negating the need for the second grippers 100.

The circuit module 16 and the connector 10 can be shipped by the manufacturer to an end-user in a partially assembled state, as shown in FIG. 8. The circuit module 16 may be mounted onto the connector 10, in a manner consistent with the second contact portion 90 of the contact 30. In the embodiment shown, the circuit module 16 would be positioned to the frame 32 by the orientation features 52 and the electrical connection between the terminals 28 and the second contact portion 90 would be established as the circuit module 16 is mated to the connector frame 32 by the first grippers 98 of the clip 94.

When the end-user receives this package 104 in the field, the pre-existing electronic component 14 may be disabled, if required, and the package 104 attached. The keying features 50 orientate the contacts 30 within the connector 10 to the leads 20 of the pre-existing electronic component 14 by receiving the bumpers 22 of the pre-existing electronic component 14. The package 104 is then mated to the pre-existing electronic component 14 establishing a separable and wiping electrical connection between the leads 20 and the first contact portion 78. The second grippers 100 are then engaged on the bumpers 22 of the pre-existing electronic component 14, maintaining the electrical interconnection between the leads 20 and the contact 30.

Figure 4:
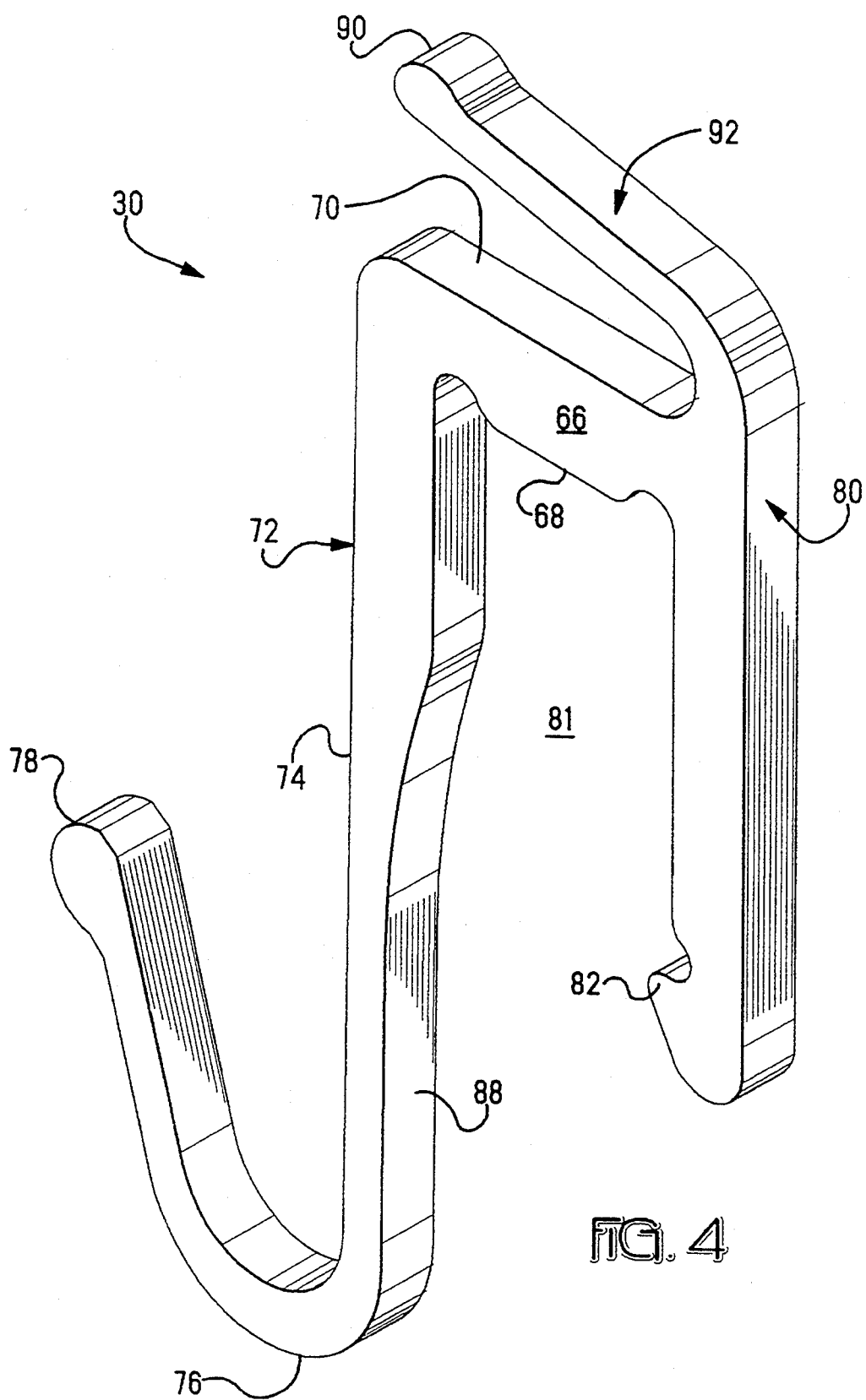
FIG. 4 is a perspective view of the contact.
Figure 4A:
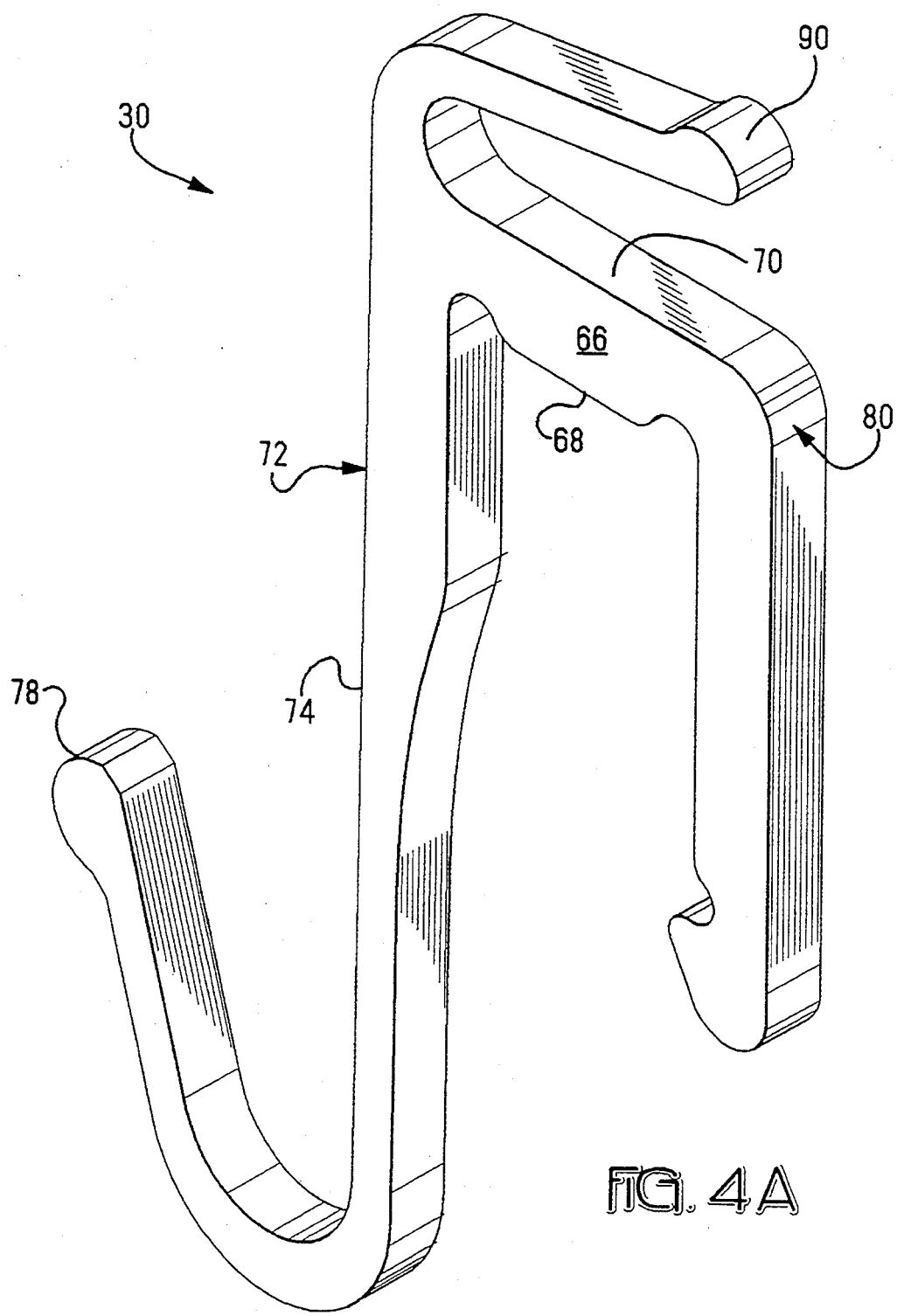
FIG. 4A is a perspective view of an alternative configuration of the contact.

FIG. 4A shows an alternative contact 30 that would be useable with the connector 10 described above. The contact 30 is essentially the same as that previously described with the exception of the second contact arm 92. In this embodiment, the second contact arm 92 is joined to the second side 70 of the base 66 above the back-up arm 80 instead of above the contact arm 72, as in the previously described embodiment (FIG. 4). This alternative configuration has the advantage of more equally balancing the torques imposed upon the contact 30 when engaged with both the leads 20 and the terminal 28 of the circuit module 16.

Figure 9:
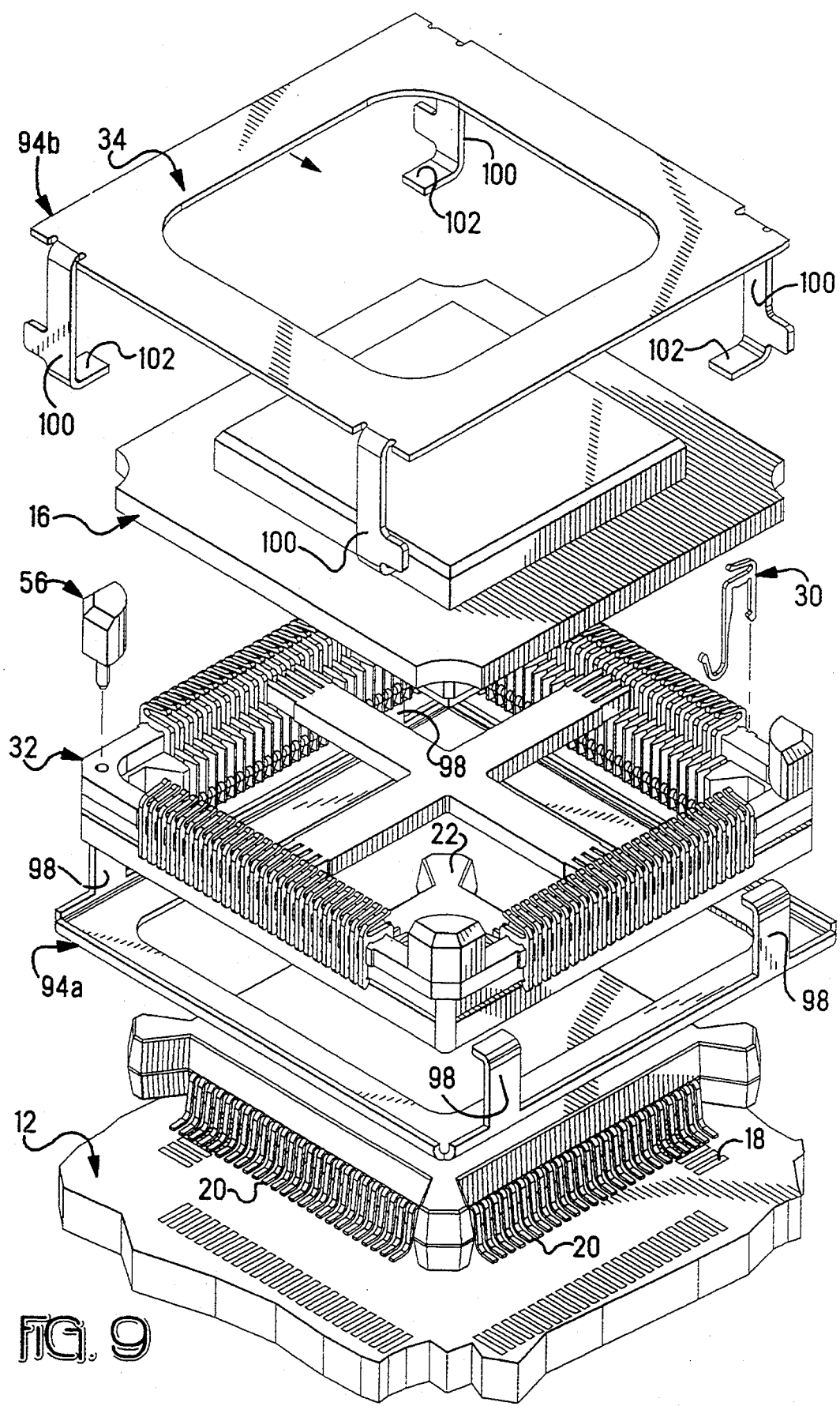
FIG. 9 is a partially exploded upper perspective view of another embodiment of the connector that utilizes a two piece clip.

FIG. 9 shows another embodiment of the connector 10 that utilizes a two piece clip, a package clip 94a and an attachment clip 94b, as the mechanism 34 for retaining the contacts 30 in electrical engagement with the leads 20 and the terminals 28 of the circuit module 16. The package clip 94a is constructed to fit beneath the frame 32 without interfering with the contacts 30 therein or the leads 20 of the pre-existing circuit component 14. The package clip 94a has first grippers 98 that, as in the above described embodiment, assure that the second contact portion 90 of the contact 30 remains in electrical engagement with the terminals 28 of the circuit module 16. The circuit module 16 is pressed upon the frame 32 of the connector 10, with the package clip 94a thereunder, the first grippers 98 engage the circuit module 16, thereby establishing the partially assembled state shown in FIG. 8 for shipment to the field.

The attachment clip 94b straddles the circuit module 16 and has second grippers 100 that are constructed to fit under the bumpers 22 of the pre-existing electronic component 14 to hold the circuit module and connector frame 32 package tightly thereupon, as described for the single piece clip 94 above. This attachment clip 94b is constructed to be more easily attachable in the field than the single piece clip 94. In this version, rather than spreading the second grippers 100 apart to engage the pre-existing electronic component 14, the clip 94b is slidable so that the second grippers 100 fit under the bumpers 22 without significant deformation.

The circuit module 16 and the connector frame 32, partially assembled by way of the package clip 94a, are placed above the pre-existing electronic component 14 so that the contacts 30 are aligned with their respective leads 20. The attachment clip 94b is placed over the circuit module 16 so that the second grippers 100 extend towards the pre-existing electronic component 14 and are located adjacent the bumpers 22. By pushing down on the circuit module 16, the clasp 102 of the second grippers 100 is biased below the underside of the bumpers 22. The attachment clip 94b is pushed sideways so that the clasps 102 of the second grippers 100 slides beneath the bumpers 22, thereby maintaining positioning of the circuit module 16, connector frame 32 and the pre-existing electronic component 14 so that the contact 30 remains engaged with both the lead 20 and the terminal 28.

Figure 10:
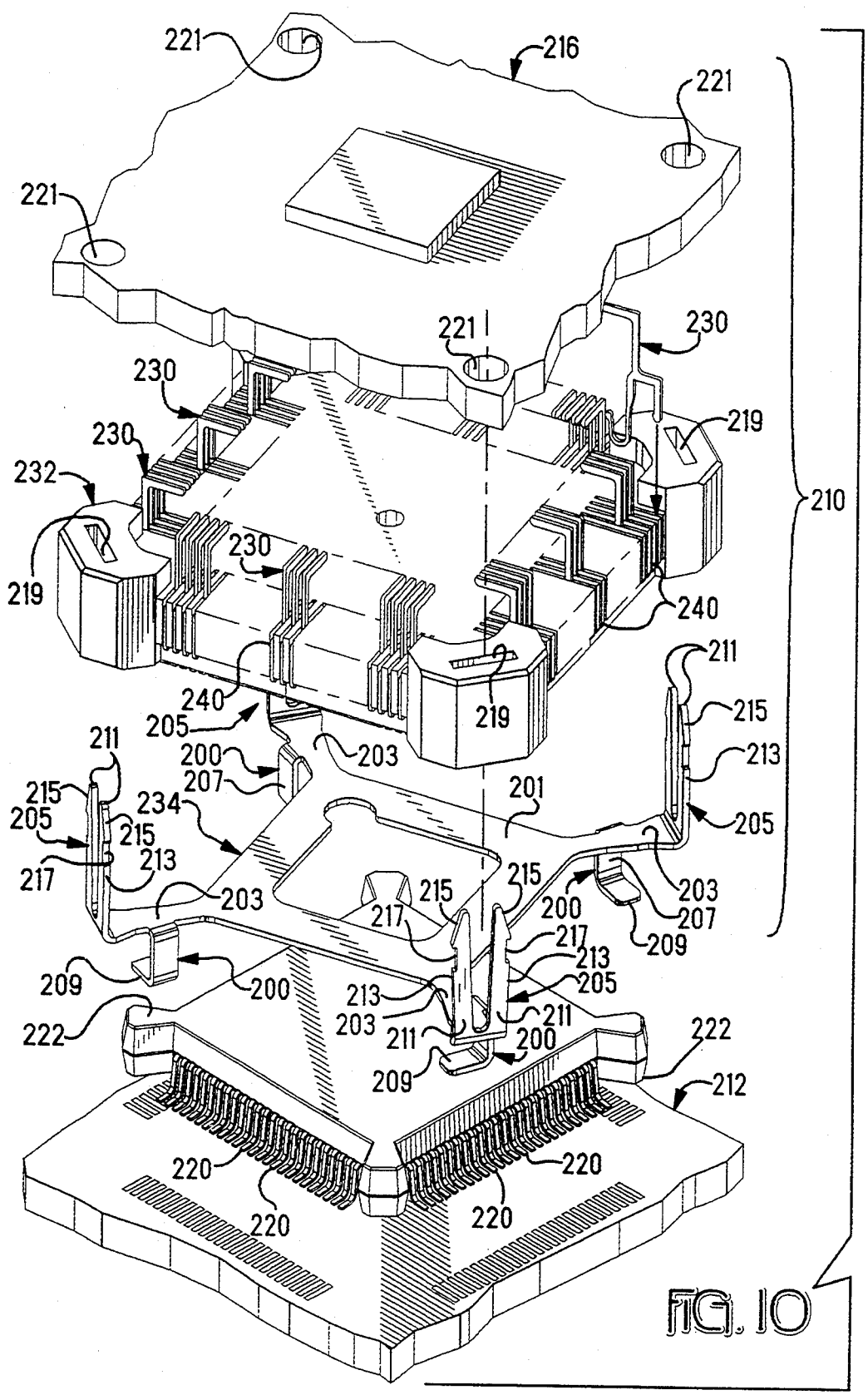
FIG. 10 is a partially exploded upper perspective view of another embodiment of the connector and the associated components.
Figure 11:
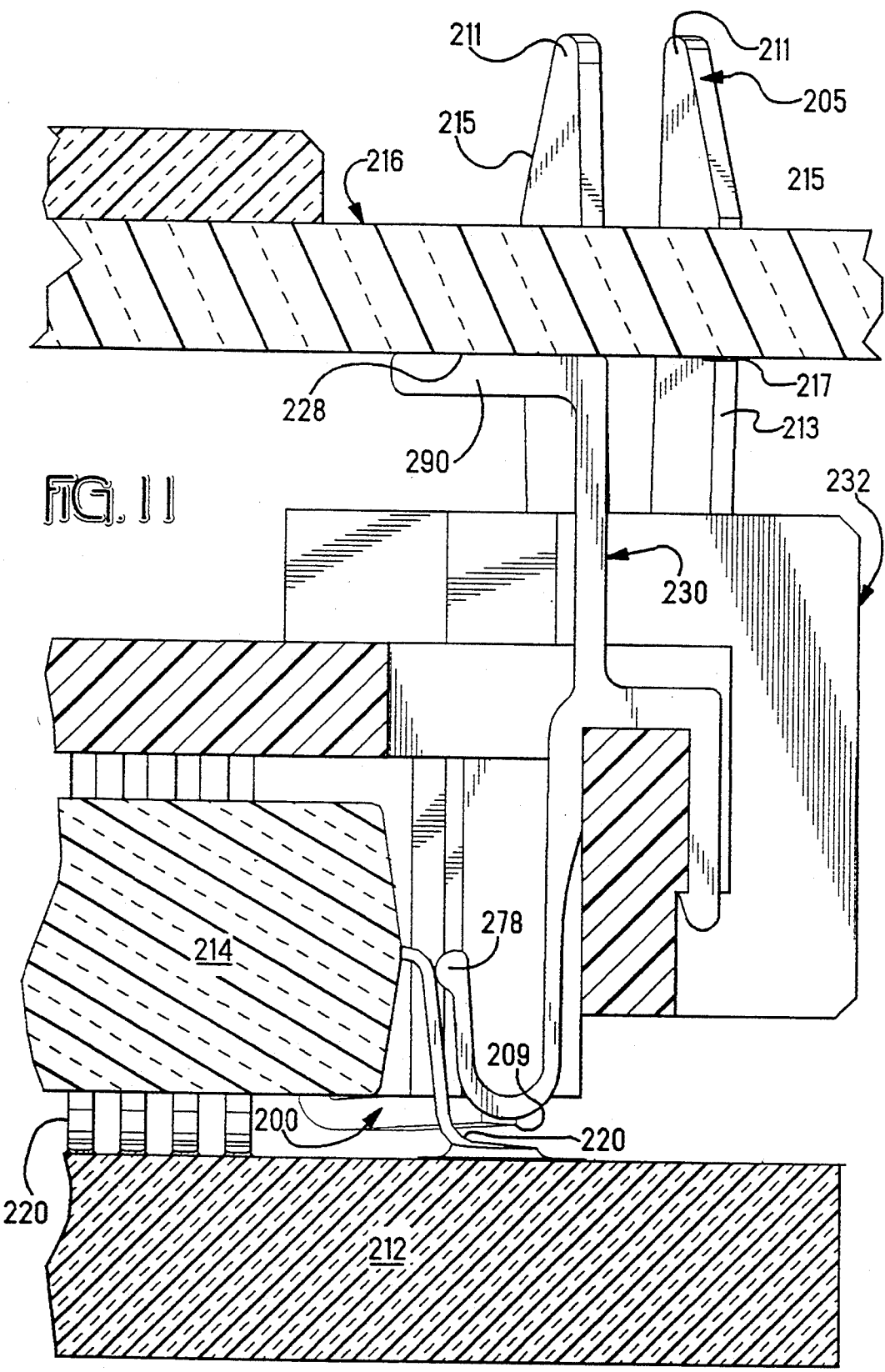
FIG. 11 is a partial cross-sectional view of the assembled connector of FIG. 9.

FIGS. 10 and 11 show another embodiment of a connector 210 for electrically connecting a circuit module 216 to the leads 220 of a pre-existing electronic component 214 that is similar to the previously described embodiment. As illustrated in FIG. 10, the pre-existing electronic component 214 is shown as a Plastic Quad Flat Pack (PQFP), that is mounted upon a substrate 212, such as, a printed circuit board, by, for example, surface mount soldering techniques. The primary distinction of this embodiment over the one described above is the mechanism or clip 234 for holding the components of the assembly together to assure that a proper interconnection with the leads 220 is reliably achieved and maintained. In this particular embodiment the clip 234 is positioned between the pre-existing electronic component 214 and a connector frame 232 upon which the circuit module 216 is positioned in piggy-back fashion to engage the contacts 230 contained within the frame 232.

In the description of this embodiment, only the relevant differences will be presented in detail with the previously presented aspects of the prior embodiment being applicable to this embodiment as well. The contacts 230 are essentially the same as those previously described, especially the version of the contact shown in FIG. 5 where the contact is adapted for a surface mount soldering to the terminals of the circuit module. The contacts 230 of this embodiment are received within a frame 232 that is similar to that described above having channels 240 to retainably receive the contacts 230 in the same manner as that described above. The second contact portions 290 of the contacts 230 are aligned with, and then soldered to, the terminals 228 of the circuit module 216 (FIG. 11).

The primary focus of this embodiment is an alternative mechanism for maintaining the relationship between the connector 210, the contacts 230 therein, and pre-existing electronic component 214 attached to the substrate 212. This mechanism is the clip 234 shown in FIG. 10.

The clip 234 has a thin central section 201 that is sandwiched between the pre-existing electronic component 214 upon the substrate 212 and the frame 232 of the connector 210 when mated. This central section 201 is thin to minimize the overall height of the connector 210 above the pre-existing electronic component 214. Spokes 203 extend outward from the central section 201. Each spoke 203 has a second gripper 200 extending downwardly towards the pre-existing electronic component 214 and a board lock 205 extending upward therefrom.

The second grippers 200 are constructed to hold the clip 234 tightly to the pre-existing electronic component 214, in a manner similar to the way the second grippers 200 function in the previously described embodiment. The second gripper 200 extends downward from the side of the spoke 203 along a leg 207 to a lip 209 that fits under a respective bumper 222 on the pre-existing component 214. Each second gripper 200 is constructed to be open facing in the same direction so that by rotating the clip 234 (clockwise for the embodiment shown in FIG. 10) the lips 209 of all the second grippers 200 will engage the underside of their respective bumper 222 simultaneously, thereby locking the clip 234 to the pre-existing component 214. The clip 234 may be removed from the pre-existing electronic component 214 by rotating the clip 234 in the opposite direction (counterclockwise in FIG. 10), thereby disengaging the lips 209 of the second grippers 200 from beneath the bumpers 222.

The board lock 205 is constructed to hold the clip 234 tightly to the frame 232 and the circuit module 216. The board lock 205 has a pair of spaced apart fingers 211 that diverge slightly from each other as they extend upwardly from the spoke 205 in a common plane. These fingers 211 have some resiliency and can be displaced towards each other by compression. Each finger 211 has an outward edge 213 that faces away from the other corresponding finger 211. The outer edge 213 includes a camming surface 215 and a retention notch 217 for holding the circuit module 216 in place.

These board locks 205 are positioned so that they pass through corresponding slots 219 in the frame 232 of the connector 210. The slots 219 are sized to receive the board lock 205 without compressing the fingers 211. A significant amount of lead-in may be incorporated into the slots for ease of assembly, thereby enabling the board locks to be easily inserted therein under the blind mating conditions. By orienting the board locks 205 and appropriately configuring their corresponding slots 219, the freedom of movement of the frame 232 can be limited without requiring the board locks 205 to exert a positive force on the frame 232. This assures that the contacts 230 within the frame 232 are aligned with their respective corresponding leads 220 of the pre-existing electronic component 214 and that alignment is maintained.

The fingers 211 of the board lock 205 extend upwardly through their respective slots 219 to the circuit module 216. The circuit module 216 has mounting holes 221 that correspond to the board locks 205. These mounting holes 221 are smaller than the greatest width of the diverging fingers 211 above the retention notches 217 but larger than the minimum width of the oppositely facing camming surfaces 215. The board lock 205 will initially fit within the mounting hole 221 until coming into contact with the camming surface 215. By pressing the circuit module 216 downward upon the camming surfaces 215 the fingers 211 are deflected slightly enabling the circuit module 216 to pass over what was the greatest width of the diverging outer surfaces 213 and be received in the retention notches 217. Whereupon the fingers 211 return towards their original position, captivating the circuit module 216 within the retention notches 217, and the frame 232 thereunder, to the clip 234.

In practice the contacts 230 would be placed into the frame 232 in their respective channels 240. The terminals 228 of the circuit modules 216 would be positioned relative the second contact portions 290 of the contacts 230 and be soldered together using conventional surface mount soldering techniques. This assembly of the frame 232 and circuit module 216, along with the clip 232, would be field installed.

The clip 232 would be placed upon the pre-existing electronic component 214 so that the second grippers 200 are extending downward and open towards their respective bumper 222. The clip 232 is then rotated until the leg 207 of the second gripper 200 comes into contact with bumper 222, placing the lip 209 of the second gripper 200 beneath the bumper 222, thereby connecting the clip 232 to the pre-existing electronic component 214. The circuit module 216 and connector frame 234 assembly would then be placed over the board locks 205 so that the contacts 230 correspond to their respective leads 220. It would be possible to incorporate conventional polarizing features, as discussed above, to assure that the proper mating orientation is achieved. As the frame 234 and the circuit module 216 are pressed down, the first contact portion 278 (FIG. 11) of the contacts 230 wipe the leads 220 of the pre-existing electronic component 214, thereby establishing a reliable electrical interconnection. When the mounting holes 221 of the circuit module 216 reach the retention notches 217 of the board lock 205, the frame 234 and circuit module 216 are locked to the clip 232, thereby connecting the terminals 228 of the circuit module 216 to the leads 220 of the pre-existing electronic component 214.

Figure 12:
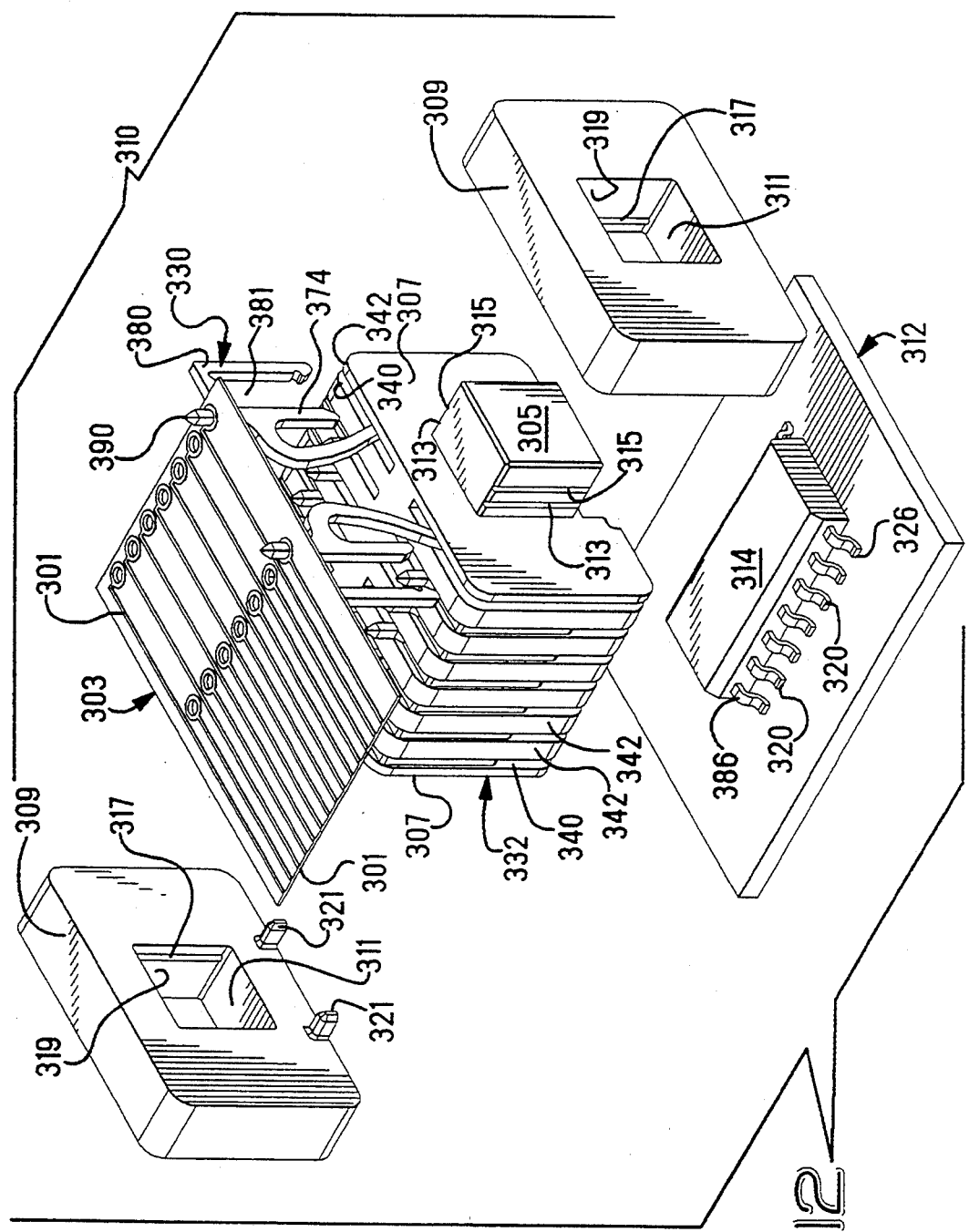
FIG. 12 is a partially exploded upper perspective view of yet another embodiment of the connector that utilizes a flat flex cable and the associated components.
Figure 13:
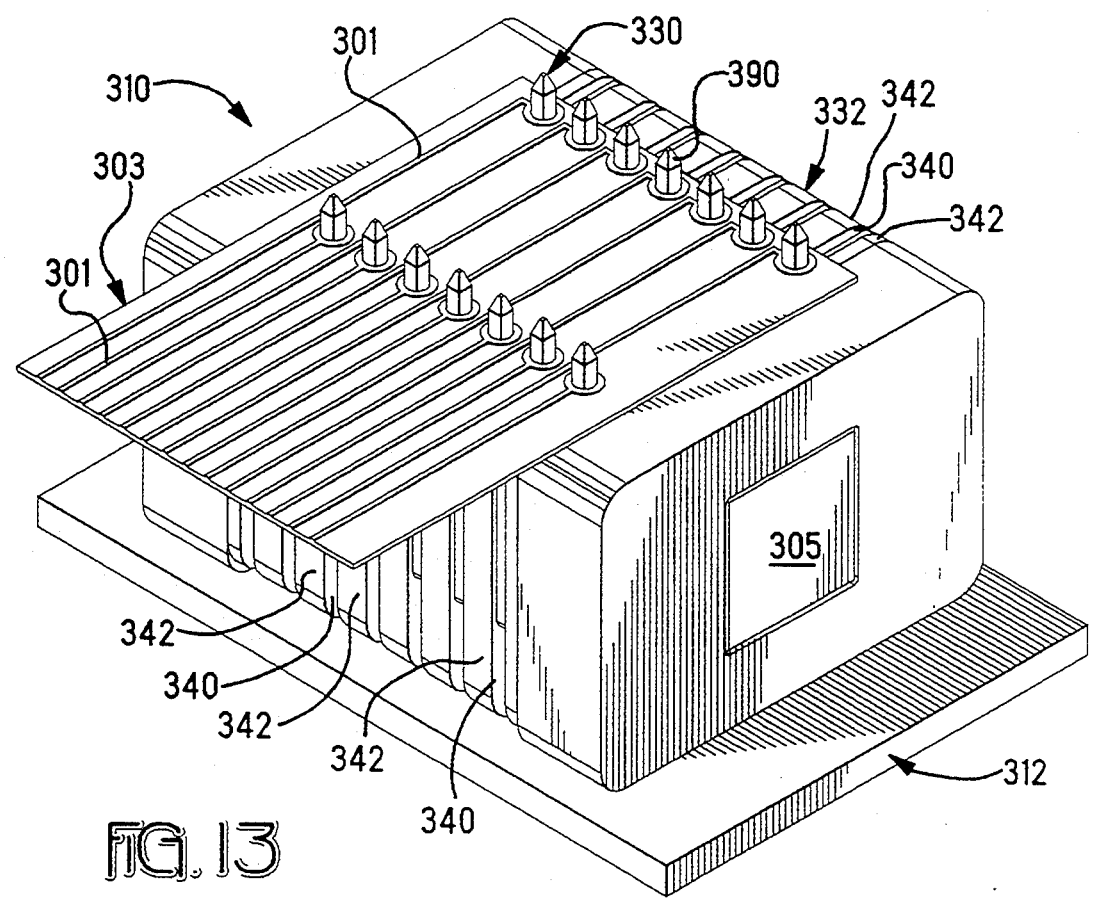
FIG. 13 is a partially cut-away perspective view of the connector of FIG. 11 mated with the pre-existing electronic component.
Figure 14:
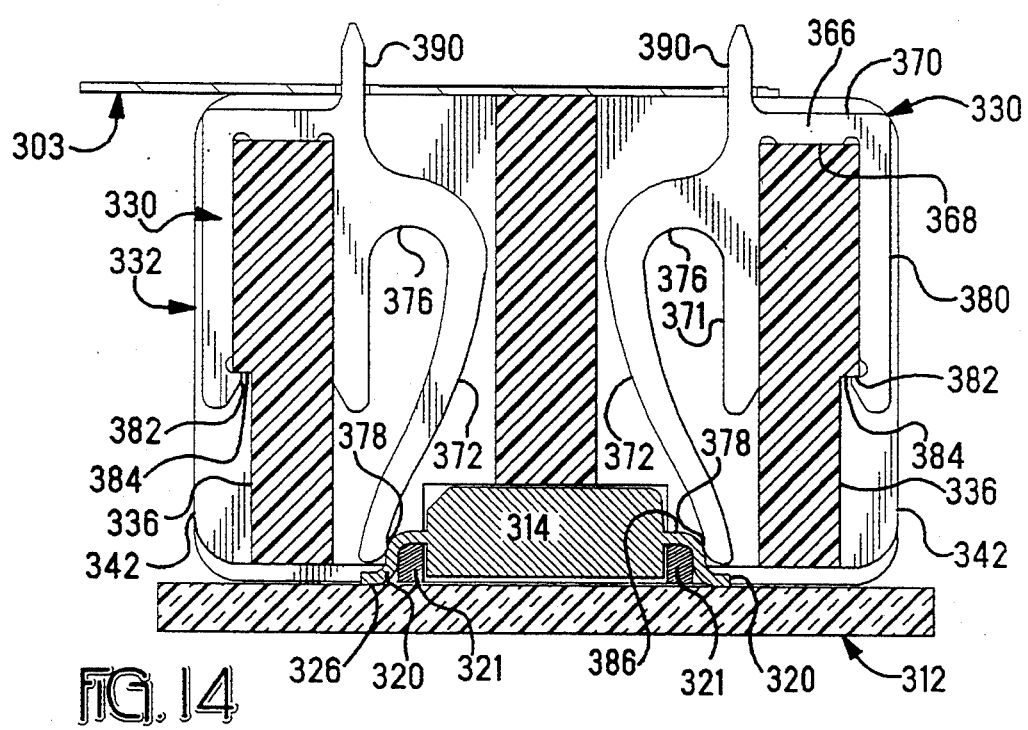
FIG. 14 is a sectional view of the assembled connector of FIG. 12 taken along line 13—13.

FIGS. 12–14 show yet another connector 310 for electrically interconnecting the leads 320 of a pre-existing circuit component 314, illustrated in FIG. 12 as a 14 position, dual-in-line package that is mounted upon a substrate 312, for example by surface mount soldering to a printed circuit board. In this particular embodiment, conductive paths 301 of a flat flex cable 303 interconnect the leads 320 of the pre-existing electronic component 314 with the terminals of the circuit module (not shown in FIGS. 12–14) by way of contacts 330 within the connector 310.

The flat flex cable 303 enables the circuit module (not shown in FIGS. 12–14) to be located away from the pre-existing electronic component 314. The conductive paths 301 of the flat flex cable 303 may be connected to the circuit module by conventional means, such as a connector or by hard soldering the conductive paths 301 directly to the terminals of circuit module. The flat flex cable may alternatively be a ribbon cable, individual wires or any other device that would conduct the electronic signals between the pre-existing electronic component 314 and the circuit module. By not piggybacking the circuit module upon the pre-existing electronic component 314, the height above the substrate is minimized enabling adjacent substrates 312 to be more closely arranged.

The contacts 330 that connect the conductive paths 301 of the flat flex cable 303 to their respective leads 320 of the pre-existing package 314 are contained within a frame 332. The frame 332 has a plurality of channels 340 that are in spaced alignment with the leads 320 of the pre-existing electronic component 314. The channels 340 are constructed to receive and retain individual contacts 330. The channels 340 are defined by a series of spaced apart webs 342 and a side portion 336 (shown in cross-section in FIG. 14) which is engaged by the contact 330.

The frame 332 has opposing rectangular posts 305 that extend from respective end surfaces 307 of the frame 332 upon which opposing collars 309 will be received. This mechanism is an alternative to the clip described above. The post and collar mechanism 305/309 enables the frame 332, and the contacts 330 therein, to be reliably positioned and retained upon the pre-existing package 314, assuring that electrical interconnection with the leads 320 by the contacts 330 is established so that, by way of the flat flex cable 303, the terminals of the circuit module (not shown in FIGS. 12-14) may be electrically connected therewith.

Each post 305 fits within a respective central opening 311 of the mating collar 309 in a sliding fit. Each post 305 has a first recess 313 closest to the end surface 307 and a second recess 315 that is further away from the end surface 307. The recesses 313,315 are linear depressions formed across the post 305. In the embodiment shown, each post 305 has two similarly positioned recesses 313,315 on opposite surfaces of the posts to receive corresponding detents 317, or ribs, positioned along an inner surface 319 of the central opening 311 of the corresponding collar 309.

The detents 317 shown within the central opening 311 of the collar 309 in FIG. 12 are ribs, but they could also be molded pimples, spring biased balls plungers or retainers, or various other types of retention features. In addition, the recesses 313,315 in the post 305 could be distinct cylindrical depressions (dimples). The posts 305 could be cylindrical members having circumferential recesses or depressions. The primary concern of the detent/recess 317/313,315 interface is to oppose movement of the collar 309 along the post 305 to assure that the connector 310 remains attached to the pre-existing electronic component 314. This enables a large number of acceptable configurations of the recesses and detents to be used.

In order to maintain the contacts 330 within the frame 332 in electrical interconnection with the leads 320 of the pre-existing electronic component 314, each of the collars 305 have retention studs 321 facing inward towards the frame (FIG. 12). These retention studs 321 are constructed to fit under the corresponding leads 320 at the ends of the pre-existing electronic component 314 (as best seen in FIG. 12) when the detent 317 within the collar 309 is retained within the first recess 313 of the post 305, thereby locking the connector 310 to the pre-existing electronic component 314. When the detent 317 is within the second recess 315 the retention studs 321 are clear of the leads 320 and the connector 310 may be removed.

The contacts 330 (best shown in FIG. 12) are constructed for electrically interconnecting the conductive paths 301 of the flex film cable 303 to the respective leads 320 of the pre-existing electronic component 314. The contact 330 is retainably positioned upon the side portion 336 within the channels 340 that are defined by the webs 342 to correspond with the respective lead 320. The contact 330 may be stamped from various metals and then plated in order to establish the desired mechanical and electrical properties.

Each contact 330 has a base 366 with a first side 368 and a second side 370. A straight section 374 extends from the first side 368 generally opposite a back-arm 380 that also extends from the first side 368 and is spaced thereapart to define an opening 381 sized to receive the side portion 336 of the frame 332. The back-up arm also includes a hook 382 that engages a recess 384 in the side portion 336 to retain the contact 330 and counteract the torques exerted on the contact 330 as the connector 310 is mated with the pre-existing electronic component 314, as described previously.

Extending from the straight section 374, opposite the opening 381, is a contact arm 372. The contact arm 372 extends out from the straight section 374 in a generally transverse orientation before entering a bent back portion 376 that positions a first contact portion 378 at the desired location to electrically engage the leads 320. It is desirable to have the first contact portion 378 as far away from the solder joint 326 at the substrate 312 as possible, thereby minimizing the stresses imposed on the solder joint 326 as previously described above, and as close as possible to the portion 386 of the lead 320 that is essentially horizontal, thereby minimizing the resultant force on the solder joint 326. The bent back portion 376 and the length of the contact arm 372 between the bent back portion 376 and the first contact portion 378 provide the desired compliance to assure a reliable wiping interconnection is formed and maintained with the lead 320. In order to accommodate the low profile of some pre-existing electronic packages 314, the placement of the bent back portion 376 within the contact arm 372 is higher in relation to the lead 320 than those shown previously.

Extending from the second side 370 of the base 366 of the contact 330 is the second contact portion 390, which in this embodiment is a pin adapted for through-hole or soldered through-hole connection with the conductive pathways 301 of the flat flexible cable 303. As previously indicated, this second contact portion 390 may take on alternative configurations. The attachment of the contacts 330 to the conductive pathways 301 assures connection to the terminals at the circuit module and provides flexibility to position the circuit module in a location remote from the pre-existing electronic component 314.

The connector 310, with the contacts 330 within the frame 332 and the flat flex cable 303 attached thereto, may be easily installed in the field. The connector 310, with the detents 317 of the collars 309 positioned in their respective second recesses 315, is positioned above the pre-existing electronic component 314 so that the first contact portions 378 of the contacts 330 are aligned with their respective leads 320 of the pre-existing electronic component 314. The connector 310 is then pressed down, seating the connector 310 upon the pre-existing package 314 so that the first contact portion 378 of the contact 330 wipes the lead 320 establishing the electrical interconnection. Once the connector 310 is seated the collars 309 are moved inward on the posts 305 so that the detents 317 are now received within their corresponding first recesses 313, thereby placing the retention studs 321 under the corresponding leads 320 of the pre-existing electronic component 314 in order to keep the connector 310 attached therewith. If the flat flex cable 303 has not previously been connected to the circuit module that may be done now, thereby enabling the operation of the circuit module to be accomplished through interconnection with the leads 320 of the pre-existing electronic component 314.

It will be appreciated that the present invention has significant advantages for connecting the terminals of a circuit module to the leads of a pre-existing electronic component. It should be recognized that the above-described embodiments, of the contact and the connector, constitute the presently preferred form of the invention and that the invention may take numerous other forms. Accordingly, the invention should be only limited by the scope of the following claims.

I claim:

1. A connector for electrically interconnecting terminals of a circuit module located above a pre-existing electronic component to respective leads extending from the preexisting electronic component, where the leads are affixed to respective contact pads on a substrate, the connector comprising:
- a frame that generally encompasses the pre-existing electronic component;
- a plurality of contacts, received by said frame and
- a mechanism for maintaining the circuit module, the connector, and the pre-existing electronic component in proper mating relation;
- whereby, an electrical interconnection is established between respective terminals and contact pads by way of the leads and the contacts, wherein said mechanism comprises
- a clip disposed about the module and having a plurality of first grippers extending therefrom to hold said frame tightly to the module and a plurality of second grippers to hold the pre-existing electronic component tightly to said frame wherein, the circuit module is positioned above the pre-existing electronic component and said first gripper are board locks that extend through the frame into a mounting hole of the circuit module.

2. The connector of claim 1, wherein said frame includes a post extending therefrom and a collar that is slidably received on said spot, said collar having retention studs thereupon that engage at least some of the leads to attach said frame to the pre-existing electronic component.

3. The connector of claim 1, wherein conductive pathways interconnect the second contact portions of the contact with respective terminals of the circuit module, thereby providing for locating of the circuit module remote of the pre-existing electronic component.

4. A connector for electrically interconnecting terminals of a circuit module to respective leads extending from a pre-existing electronic component where the leads are affixed to respective contact pads on a substrate, the connector comprising:
- a frame generally encompassing the pre-existing electronic component, said frame having a post extending therefrom;
- a plurality of contacts positioned within said frame, each contact having a resilient contact arm that includes a first contact portion separably connectable to the lead, said contact arm constructed to deflect as it engages the lead, thereby storing energy to maintain the engagement, a back up arm that retains each contact within said frame and a second contact portion electrically interconnected with the terminal of the module; and
- a collar having a retention stud, said collar being slidable on said post between an engaged position where said retention stud fits under the pre-existing electronic component, thereby connecting said frame to the component, and a disengaged position where said retention stud is free of the pre-existing electronic component, thereby providing for attachment and removal of said frame from the component;
- whereby, an electrical interconnection is established from the terminals of the circuit module, through the contacts of the connector, to the respective leads of the pre-existing electronic component and through to the corresponding contact pads of the substrate.

5. The connector of claim 4, wherein the second contact portion is electrically connected to the terminals by way of conductive pathways, whereby the circuit module is located remote of the pre-existing electronic component.

6. A connector for electrically interconnecting terminals of a circuit module located above a pre-existing electronic component to respective leads extending from the pre-existing electronic component where the leads are affixed to respective contact pads on a substrate, the connector comprising:
- a frame that generally encompasses the pre-existing electronic component engaging the module;
- a plurality of contacts, received by said frame, and
- an attachment clip having a plurality of second grippers, said attachment clip being transversely slideable relative to said frame whereby said attachment clip has a first position wherein, said second grippers are disengaged from the pre-existing electronic component and a second position wherein, said second grippers slide under the pre-existing electronic component thereby retaining the frame to the pre-existing electronic component.

7. The connector as recited in claim 6 and further comprising: a package clip disposed about the module to hold said frame tightly to the module.

* * * * *